(12) United States Patent
Simsek-Ege et al.

(10) Patent No.: US 9,780,102 B2
(45) Date of Patent: Oct. 3, 2017

(54) MEMORY CELL PILLAR INCLUDING SOURCE JUNCTION PLUG

(71) Applicant: Micron Technology, Inc., Boise, ID (US)

(72) Inventors: Fatma Arzum Simsek-Ege, Boise, ID (US); Krishna K. Parat, Palo Alto, CA (US); Luan C. Tran, Meridian, ID (US); Meng-Wei Kuo, Boise, ID (US); Yushi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/536,021

(22) Filed: Nov. 7, 2014

(65) Prior Publication Data

US 2016/0133638 A1    May 12, 2016

(51) Int. Cl.
| | | |
|---|---|---|
| *H01L 29/788* | (2006.01) | |
| *H01L 27/11524* | (2017.01) | |
| *H01L 27/1157* | (2017.01) | |
| *H01L 27/11582* | (2017.01) | |
| *H01L 27/11556* | (2017.01) | |
| *H01L 21/822* | (2006.01) | |
| *H01L 27/11578* | (2017.01) | |
| *H01L 27/11529* | (2017.01) | |
| *H01L 27/1158* | (2017.01) | |

(52) U.S. Cl.
CPC .... *H01L 27/11524* (2013.01); *H01L 27/1157* (2013.01); *H01L 27/11556* (2013.01); *H01L 27/11582* (2013.01); *H01L 21/8221* (2013.01); *H01L 27/1158* (2013.01); *H01L 27/11529* (2013.01); *H01L 27/11578* (2013.01)

(58) Field of Classification Search
CPC ......... H01L 27/11524; H01L 27/11556; H01L 27/11582; H01L 27/1157; H01L 27/11578; H01L 27/1158; H01L 27/11529; H01L 21/8221
See application file for complete search history.

(56) References Cited

U.S. PATENT DOCUMENTS

| | | | | |
|---|---|---|---|---|
| 7,847,329 B2* | 12/2010 | Pellizzer | ............. | H01L 27/2454 257/302 |
| 2010/0224929 A1* | 9/2010 | Jeong | ................. | H01L 27/11568 257/324 |
| 2011/0147824 A1* | 6/2011 | Son | ..................... | G11C 16/0483 257/324 |
| 2011/0298037 A1* | 12/2011 | Choe | ................... | G11C 16/0483 257/324 |
| 2012/0211823 A1* | 8/2012 | Lim | ................... | H01L 27/11565 257/326 |
| 2013/0134492 A1* | 5/2013 | Yang | ................. | H01L 27/11582 257/314 |

* cited by examiner

*Primary Examiner* — Su C Kim
(74) *Attorney, Agent, or Firm* — Schwegman Lundberg & Woessner, P.A.

(57) ABSTRACT

Some embodiments include apparatuses and methods having a source material, a dielectric material over the source material, a select gate material over the dielectric material, a memory cell stack over the select gate material, a conductive plug located in an opening of the dielectric material and contacting a portion of the source material, and a channel material extending through the memory cell stack and the select gate material and contacting the conductive plug.

31 Claims, 12 Drawing Sheets

MEMORY CELL PILLAR INCLUDING SOURCE JUNCTION PLUG

BACKGROUND

Many electronic systems, such as computers and mobile devices, usually include one or more memory devices to store information. Memory devices include memory cells. Some memory devices may include memory cells arranged in multiple levels of the device. As demand for storage capacity increases, the number of memory cell levels of some conventional memory devices may increase to accommodate the increased storage capacity. In some cases, however, fabricating such memory devices and maintaining reliable memory operations may pose a challenge.

DETAILED DESCRIPTION

Figure 1A:
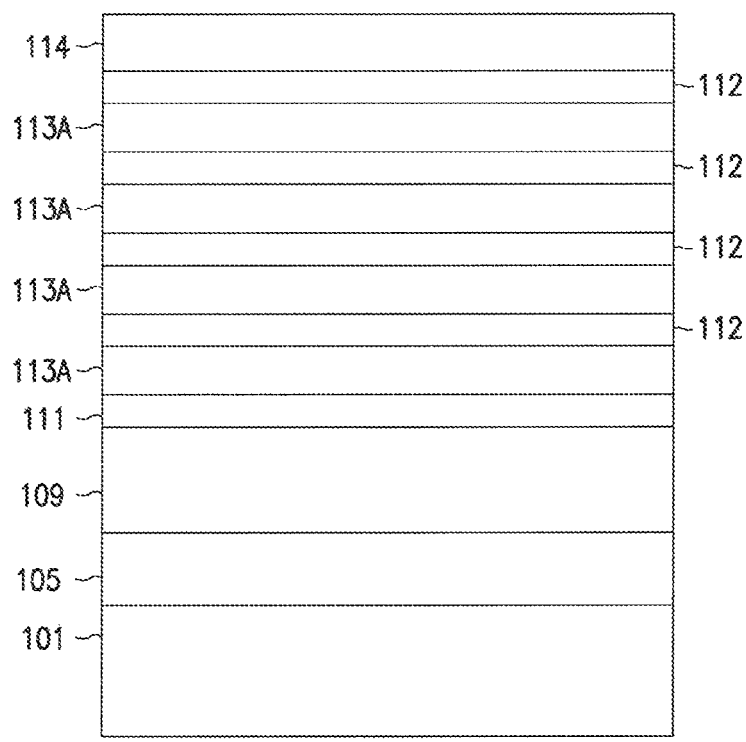
FIG. 1A through FIG. 1J show different portions of a fabrication process to form memory cells of a memory device, according to an embodiment of the invention.

The description that follows includes illustrative apparatuses (circuitry, devices, structures, systems, and the like) and methods (e.g., processes, protocols, sequences, techniques, and technologies) that embody the disclosed subject matter. In the following description, for purposes of explanation, numerous specific details are set forth in order to provide an understanding of various embodiments of the subject matter. After reading this disclosure, however, it will be evident to person of ordinary skill in the art that various embodiments of the subject matter may be practiced without these specific details. Further, well-known apparatuses, methods, and operations have not been shown in detail so as not to obscure the description of various embodiments.

Although various embodiments discussed below focus on a three-dimensional (3D) NAND memory device, the embodiments are readily applicable to a number of other electronic devices. Consequently, the described embodiments are merely given for clarity in disclosure and are not limited to NAND memory devices or even to memory devices in general.

Generally, a 3D electronic device may be considered to be a device formed by a process that combines multiple levels of electronic devices (e.g., one device formed over another) using planar formations (e.g., multiple devices on a single level). Since multiple levels in 3D devices may use approximately the same area on a substrate, an overall density of devices (e.g., memory devices) can be increased in relation to the number of levels. Generally discussed herein are three-dimensional (3D) memories, memory cells, and methods of making and using the same. In one or more embodiments, a 3D vertical memory can include a memory cell stack sharing a common cell pillar. A memory cell stack can include a stack of at least two memory cells and a dielectric between adjacent memory cells, where each memory cell includes a control gate and a charge storage structure (e.g., a floating gate, charge trap, or other memory structure) configured to store electrons or holes accumulated thereon. Information is represented by the amount of electrons or holes stored by the cell.

The methods and apparatuses discussed herein can be extended to NOR devices, microcontroller devices, other memory types, general purpose logic, and a host of other apparatuses. Different 3D devices including repeating devices (e.g., SRAM), transistors, standard CMOS logic, and so on may all benefit from application of the fabrication processes disclosed herein.

FIG. 1A through FIG. 1J show different portions of a fabrication process to form memory cells (e.g., memory cell stack of a memory array) of a memory device 100, according to an embodiment of the invention. The techniques and fabrication processes described herein can be extended to a number of different apparatuses (e.g., in addition to memory devices) to be fabricated using different processes, including, for example, a three-dimensional process. However, fabrication of memory device 100 (e.g., a vertical NAND memory device) will be described below to retain clarity and consistency in the discussions that follow.

In FIG. 1A, formation of memory device 100 can include forming a source material 101 and different levels of materials formed over source material 101. The different levels of materials may include different dielectric materials and semiconductor materials as discussed in more detail below. Each of these and other materials described herein may be applied, deposited, or otherwise formed according to techniques and methods known independently in the art. The techniques and methods may include one or more deposition activities, such as chemical vapor deposition (CVD), atomic level deposition (ALD), physical vapor deposition (PVD), or other techniques. Forming multiple materials in different levels may be accomplished via stacked deposition operations.

Although the process acts and operations described herein may refer to particular conductor, semiconductor, or dielectric materials (e.g., silicon, silicon dioxide, silicon nitride, or others), a person of ordinary skill in the art and familiar with this disclosure will recognize that other conductor, semiconductor, and dielectric materials may be substituted and still be within a scope of the disclosed subject matter. Thus, the material choices and selections described herein are merely provided as an aid in understanding some examples of a fabrication process.

For example, different types of semiconductor materials (e.g., single-crystal or amorphous silicon, germanium, other elemental semiconductor materials, compound semiconductor materials, etc.) may be used as an alternative for or in conjunction with other types of semiconductor material. Additionally, different types of dielectric materials, such as tantalum pentoxide ($Ta_2O_5$), silicon nitride ($Si_xN_y$), aluminum oxide ($Al_2O_3$), hafnium oxide ($HfO_2$), and a variety of other organic or inorganic dielectric materials, may be used as an alternative to or in conjunction with others of the materials described. Also, other combinations of materials may also be substituted or included. For example, in certain applications, described semiconductor materials may be substituted with conductor materials including, for example, silver (Ag), copper (Cu), Aluminum (Al), zinc (Zn), platinum (Pt), tungsten (W), titanium (Ti), or tantalum (Ta).

Further, different formation, process, and other discussions that follow may refer to one material formed (e.g., placed), for example, "over" or "above" another material.

Such descriptors are relative terms only and obviously depend upon an exact orientation of any resulting device. However, a person of ordinary skill in the art will readily understand the context of such relative terms upon reading and understanding the disclosure provided herein in conjunction with the respective drawings.

In FIG. 1A, source material 101 may include, for example, a conductively-doped polysilicon material or a conductively-doped region of a semiconductor substrate. As referred to herein, a semiconductor substrate can be any of the different types of substrates used in the semiconductor and allied industries, such as silicon wafers, other elemental semiconductor wafers, compound semiconductor wafers, thin film head assemblies, polyethylene-terephthalate (PET) films deposited or otherwise formed with a semiconducting material layer (followed by an annealing activity, such as excimer laser annealing (ELA) in some embodiments), as well as numerous other types of substrates known independently in the art. Also, in some embodiments, source material 101 may be formed over a non-semiconductor material (e.g., quartz, ceramic, etc.), or vice-versa.

As shown in FIG. 1A, an etch stop 105 is formed over source material 101. Etch stop 105 can directly contact source material 101. In a subsequent process (e.g., an etch process), an opening through different levels of material over etch stop 105 may be formed. Etch stop 105 may allow the depth of such opening to be controlled.

Etch stop 105 may include a high dielectric constant (high-κ) material such as aluminum oxide ($Al_2O_3$) or other high dielectric constant oxides. Other high-κ materials that can be used for etch stop 105 include, for example, hafnium silicate ($HfSiO_4$), zirconium silicate ($ZrSiO_4$), hafnium dioxide ($HfO_2$), and zirconium dioxide ($ZrO_2$). Generally, a high dielectric constant material may be considered as any material having a dielectric constant equal to or greater than the dielectric constant of silicon dioxide. Thus, etch stop 105 may include a material having a dielectric constant greater than the dielectric constant of silicon dioxide. The dielectric constant for silicon dioxide is approximately 3.9.

As shown in FIG. 1A, a source-side select gate (SGS) structure including a semiconductor material 109 (e.g., conductively-doped polysilicon) and a dielectric material 111 can be formed over etch stop 105. Dielectric material 111 may include silicon dioxide (e.g., $SiO_2$) that can be thermally-grown silicon dioxide (e.g., $SiO_2$) material or deposited silicon dioxide material.

Semiconductor material 109 (e.g., SGS select gate material) can form part of a select gate (SGS gate) of the SGS structure. Depending upon an etchant used in later process steps, semiconductor material 109 may be selected to be a p-type polysilicon (e.g., doped with boron). For example, as discussed in more detail below, a subsequent etch-back process step may employ tetramethyl-ammonium hydroxide (TMAH) as an etchant. TMAH selectively etches n-type and undoped polysilicon but may slowly etch p-type polysilicon. Selecting semiconductor material 109 to be p-type polysilicon may reduce the amount of semiconductor material 109 that is etched during a subsequent TMAH etch process.

As shown in FIG. 1A, a number of alternating materials 112 and 113A and a cap material 114 can be formed over dielectric material 111. Forming alternating materials 112 and 113A begins a fabrication process to form a memory cell stack (e.g., vertical memory cells of a memory array of memory device 100). Cap material 114 provides protection for the underlying materials during subsequent process steps. Cap material 114 may include one more materials including oxides, nitrides, high-κ dielectric materials, polysilicon, and other materials independently known in the art.

As shown in FIG. 1A, each of the levels of dielectric materials 112 is separated from a respective adjacent one of the levels of dielectric materials 112 by at least a respective one of the levels of the conductor materials 113A. Each of dielectric materials 112 may include silicon dioxide or a number of other dielectric materials. Conductor materials 113A may include conductively-doped polysilicon, metal (e.g., tungsten) or a number of other conductor or semiconductor materials. An example material for conductor materials 113A includes an n-type polysilicon.

Figure 1B:
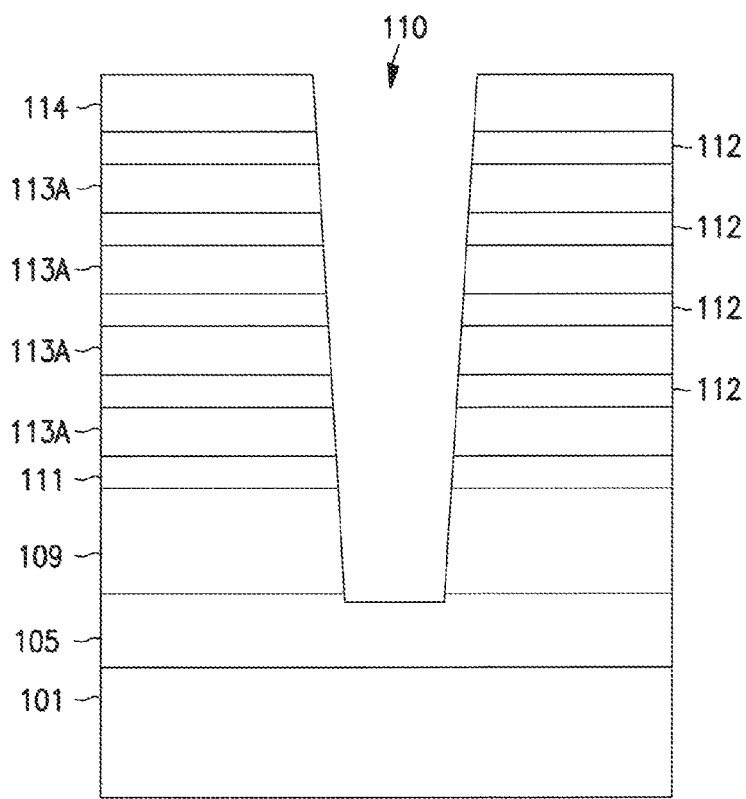

In FIG. 1B, forming memory device 100 can include forming a pillar opening (e.g., a hole) 110. Pillar opening 110 is performed in preparation for a subsequent channel formation, discussed below, and may be etched or otherwise formed to be a partial via of different shapes or a trench. For example, pillar opening 110 can be trench. In another example, pillar opening 110 may have geometries other than a trench. However, for ease in understanding fabrication operations of the disclosed subject matter discussed herein, pillar opening 110 can be considered to be an opening (e.g., an aperture) formed at least partially through the different level of materials discussed above.

Pillar opening 110 can be formed by an anisotropic dry etch process (e.g., reactive ion etch (RIE) or plasma etch). Depending upon materials selected, pillar opening 110 may be formed by one or more different types of chemical etchants (e.g., such as potassium hydroxide (KOH) or tetramethyl ammonium hydroxide (TMAH)), mechanical techniques, other types of ion milling, or laser ablation techniques. Related industries such as those involved in constructing micro-electrical mechanical systems (MEMS) devices may independently supply techniques for still further means to form pillar opening 110.

Formation of pillar opening 110 provides opening for later formation of channel material. The depth of pillar opening 110 may be controlled, such that its depth can be at the level of etch stop 105. Formation of pillar opening 110 may etch partially into etch stop 105. Etch stop 105 may allow the depth of pillar opening 110 to be controlled. The thickness of etch stop 105 may be dependent on (e.g., proportional to) the number of levels of memory cells (corresponding to the number of levels of materials 112 and 113A) formed over etch stop 105. For example, a higher number of levels of memory cells may result in a greater thickness of etch stop 105 being used. As an example, etch stop 105 may have a thickness greater than 30 nanometers. An example range of the thickness of etch stop 105 can be from approximately 30 nanometers to approximately 100 nanometers.

Figure 1C:
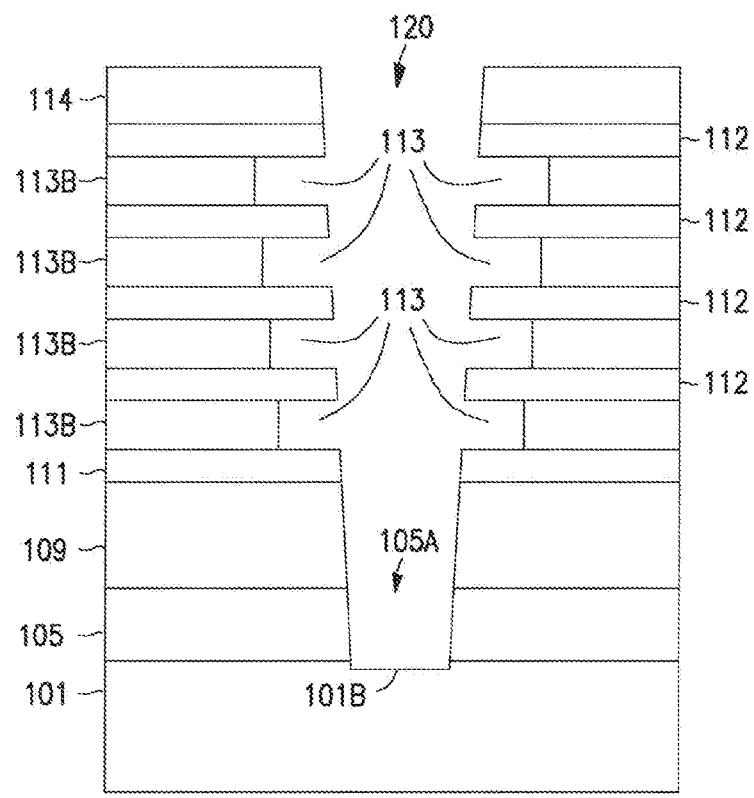

In FIG. 1C, a control-gate recess operation forms a number of control gates 113B from conductor materials 113A (FIG. 1A), thereby forming a recessed pillar opening 120. Control gates 113B can be formed by etching or otherwise have portions of each of conductor materials 113A (FIG. 1A) removed laterally (forming recesses 113 in conductor materials 113A away from the sidewall of pillar opening 110). An isotropic etchant with a relatively high selectivity ratio may be used to form recesses 113.

As an example, TMAH may be used to form recesses 113 in recessed pillar opening 120 shown in FIG. 1C. Alternatively, a person of ordinary skill in the art will recognize that other types of chemical and/or mechanical etch or formation processes may be used with an appropriate material selection. For example, other isotropic etchants may also be employed such as a hydrofluoric/nitric/acetic (HNA) acid chemical etchant.

The etch operation (e.g., using TMAH) (and potential subsequent cleaning steps) that forms recessed pillar opening 120 may also form an opening 105A in etch stop 105, such that a portion 101B of source material 101 can be exposed at recessed pillar opening 120. As described below, recessed pillar opening 120 (that includes opening 105A of etch stop 105) allows a conductive plug (e.g., conductively-doped polysilicon material) to be subsequently formed on portion 101B of source material 101 and to occupy at least a portion of opening 105A of etch stop 105. As also described below, recessed pillar opening 120 also allows a channel material to be subsequently formed.

Figure 1D:
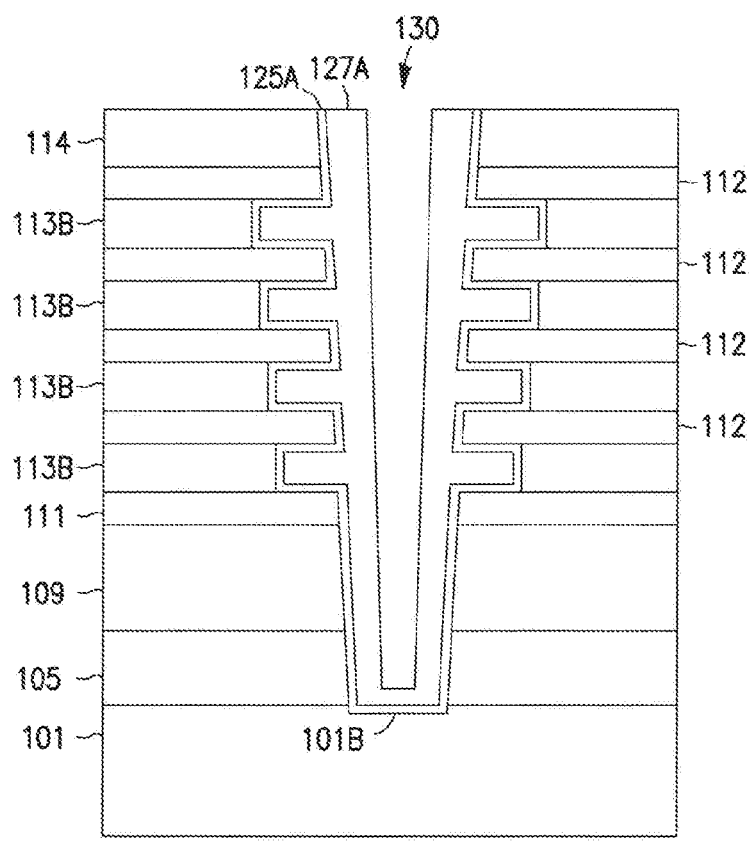

In FIG. 1D, a charge blocking dielectric (CBD) material 125A, such as an inter-polysilicon dielectric (IPD) material, can be formed on the sidewalls of recessed pillar opening 120 of FIG. 1C, followed by a charge-storage material 127A being formed adjacent CBD material 125A. As shown in FIG. 1D, CBD material 125A and charge-storage material 127A are primarily or entirely formed on opposing faces of recessed pillar opening 120 (FIG. 1C). The formation of CBD material 125A and charge-storage material 127A in recessed pillar opening 120 (FIG. 1C) results in a pillar opening 130.

In FIG. 1D, CBD material 125A may include one or more of the different dielectric materials discussed herein, including different high-κ dielectric materials. For example, CBD material 125A may include an oxide-nitride-oxide (ONO) material. Charge-storage material 127A may include one or more of the semiconductor materials discussed herein. For example, charge-storage material 127A may include polysilicon. In another example, charge-storage material 127A may include silicon nitride (e.g., $Si_3N_4$).

Figure 1E:
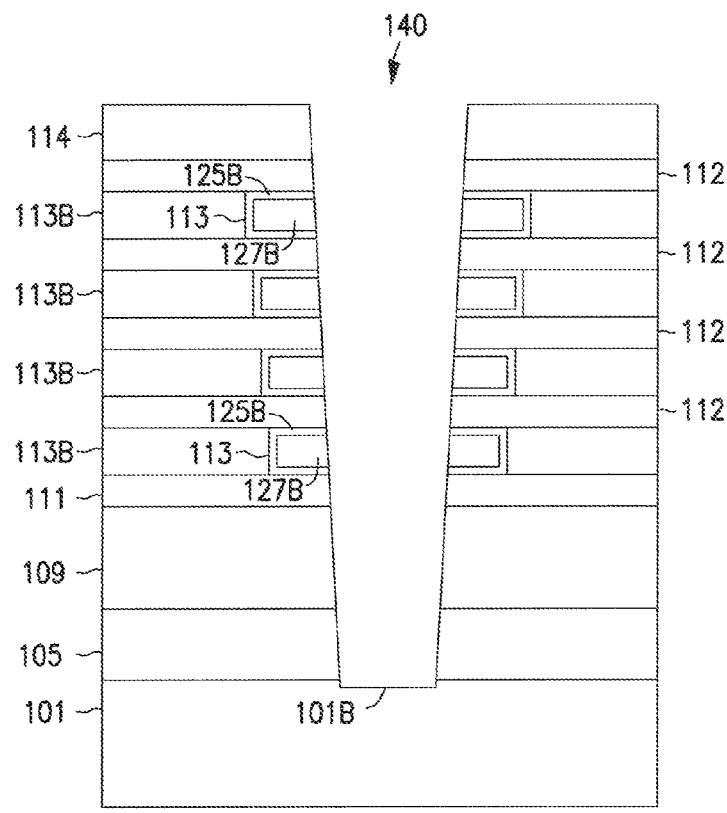

In FIG. 1E, an etch process substantially removes excess amounts of CBD material 125A and charge-storage material 127A from sidewalls and bottom of pillar opening 130 of FIG. 1D, forming a cleared pillar opening 140 and leaving a number of charge-storage structures 127B in recesses 113. Each of charge-storage structures 127B in each of recesses 113 is electrically separated from at least proximate (e.g., adjacent) ones of control gates 113B by CBD material 125B in each recess 113. Techniques to remove the materials from pillar opening 130 are known independently in the art.

Each of charge-storage structures 127B can be configured to store information and can form part of a memory cell. FIG. 1E shows four memory cells (associated with four charge-storage structures 127B) on four different levels of memory device 100. These memory cells are part of a memory cell stack of memory device 100. FIG. 1E shows memory device 100 having four levels of memory cells as an example. The levels of memory cells in the memory cell stack of memory device 100 can vary.

Figure 1F:
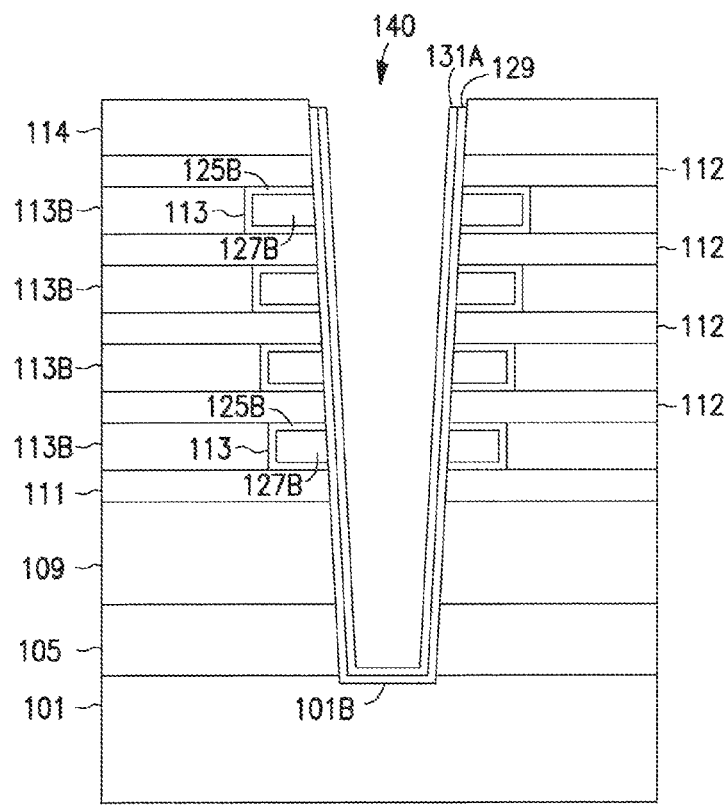

In FIG. 1F, a tunneling material 129 can be formed on sidewalls and bottom of cleared pillar opening 140, followed by formation of a sacrificial liner 131A. Tunneling material 129 may include one or more of the dielectric materials discussed herein. Sacrificial liner 131A protects tunneling material 129 from a subsequent punch-etch operation.

Tunneling material 129 may be formed from a number of dielectric materials discussed herein that allow for Fowler-Nordheim tunneling of electrons or direct tunneling of holes or other injection mechanisms. For example, tunneling material 129 may include deposited and/or thermally-grown silicon dioxide.

Sacrificial liner 131A may include polysilicon. In some cases, if tunneling material 129 is a thermally-grown silicon dioxide, sacrificial liner 131A may include a deposited silicon dioxide that can be chemically removed with a buffered-oxide etchant (BOE), such as a combination of ammonium fluoride ($NH_4F$) and hydrofluoric acid (HF) that readily etches materials such as silicon dioxide, but has little effect on materials such as polysilicon. In other cases, sacrificial liner 131A may include the same material as that of conductor materials 113A, and can be removed using an isotropic etchant, such as a directional RIE or plasma etch. Another example material for sacrificial liner 131A includes another dielectric such as borophosphosilicate glass (BPSG) supplied from a tetraethoxysilane (TEOS) source. A further example material for sacrificial liner 131A includes a solvent-based liquid that is applied to substrates using a spin-coat process, such as photoresist. The use and application of these different materials for sacrificial liner 131A will be understood by a person of ordinary skill in the art upon reading and understanding the description provided herein.

Figure 1G:
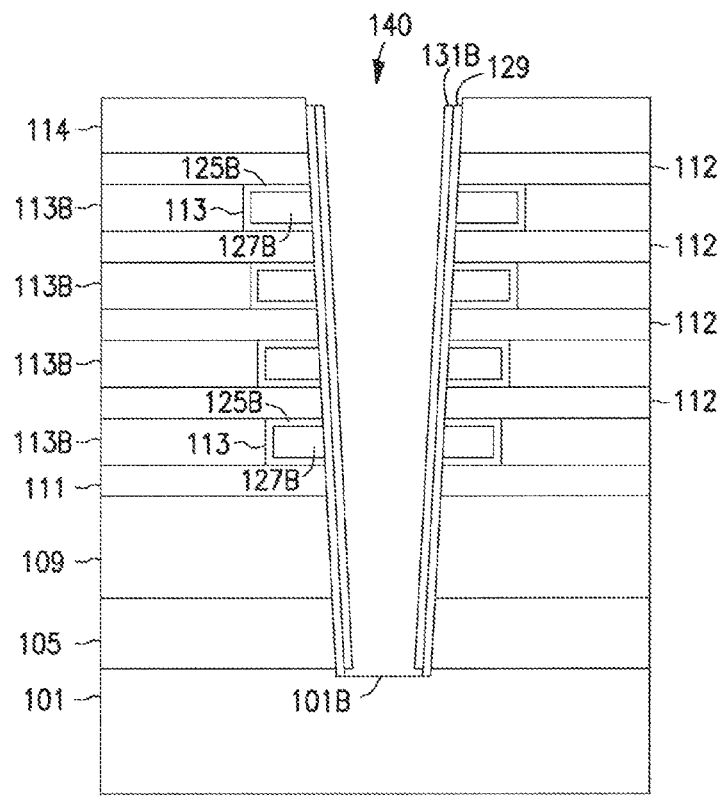

In FIG. 1G, sacrificial liner portions 131B can be formed by, for example, a punch-etch operation that clears at least the bottom portion of the sacrificial liner 131A (FIG. 1F) and the bottom portion of tunneling material 129. This opens pillar opening 140 to source material 101 and again exposes portion 101B of source material 101 at pillar opening 140.

Figure 1H:
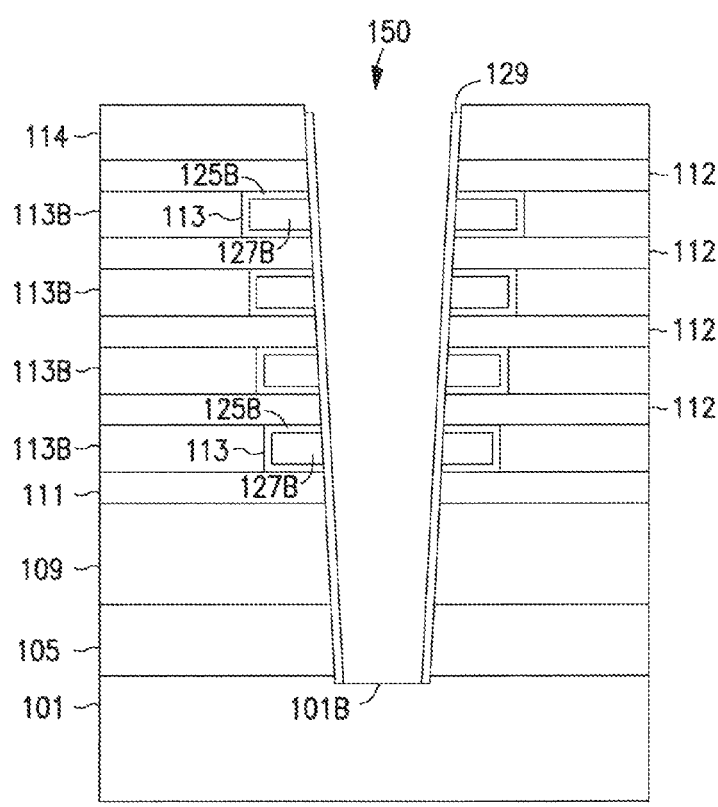

In FIG. 1H, sacrificial liner portions 131B (FIG. 1G) are removed, leaving tunneling material 129 on sidewalls of a pillar opening 150.

Figure 1I:
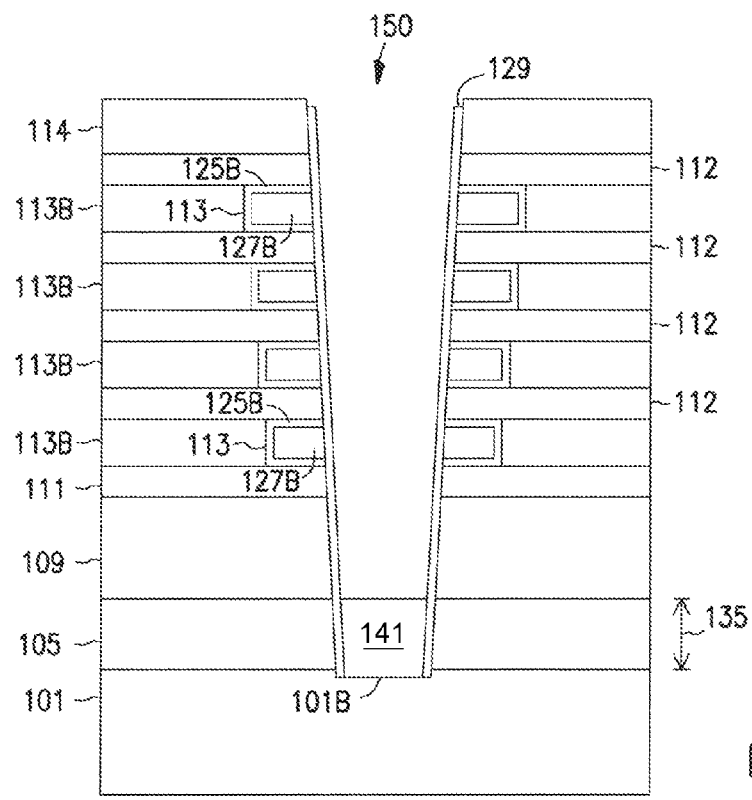

In FIG. 1I, a conductive plug 141 can be formed on portion 101B of source material 101. Conductive plug 141 directly contacts portion 101B. Conductive plug 141 can be considered as a source junction plug of memory device 100. Tunneling material 129 is on sidewalls of pillar opening 150 while conductive plug 141 is formed to prevent the material of conductive plug 141 from contacting other conductive material (e.g., semiconductor material 109) besides source material 101.

Forming conductive plug 141 can include growing an epitaxial polysilicon from portion 101B of source material 101 selective to tunneling material 129. Conductive plug 141 and source material 101 can have the same type of material (e.g., conductively-doped polysilicon of n-type).

The process of forming conductive plug 141 can also include introducing dopants into the material (epitaxial polysilicon) that forms conductive plug 141. The dopants can be introduced into the material (that forms conductive plug 141) while the material is formed or after the material is formed. Examples of the dopants include phosphorus or arsenic. The material of conductive plug 141 can be heavily doped. For example, a doping concentration in range from approximately 2E20 atoms/$cm^3$ to approximately 1E21 atoms/$cm^3$ may be used. The doping process can be performed while the material of conductive plug 141 is formed (e.g., in-situ doping).

As shown in FIG. 1I, conductive plug 141 has a thickness 135, which may also be the thickness of etch stop 105. In some cases, the thickness of conductive plug 141 can be less than, equal to, or greater than thickness 135. However, forming conductive plug 141 having a thickness greater than the thickness (e.g., thickness 135) of etch stop 105 may cause diffusion (unwanted diffusion) of dopants from conductive plug 141 to other materials (e.g., semiconductor material 109). This diffusion may change an intended threshold voltage (Vt) value of a transistor (e.g., SGS transistor) that includes a portion of semiconductor material 109 as its gate. The change in Vt value may affect the performance of memory device 100. Forming conductive plug 141 with a thickness less than a certain value of the thickness of etch stop 105 (e.g., less than one-quarter of thickness 135 in some cases or less than one-half of thickness 135 in some other cases) may not allow most of the enhancements provided by conductive plug 141 to be achieved. Thus, in some cases, in order to avoid unwanted diffusion, as mentioned above, and to achieve most of the enhancements provided by conductive plug 141, the thickness of conductive plug 141 may be selected to be in a range from at least one-half of the thickness of etch stop 105 up to the thickness (e.g., 135) of etch stop 105 in some cases. In some other cases, the thickness of conductive plug 141 may be selected to be in a range from at least one-quarter of the thickness of etch stop 105 up to the thickness of etch stop 105.

Figure 1J:
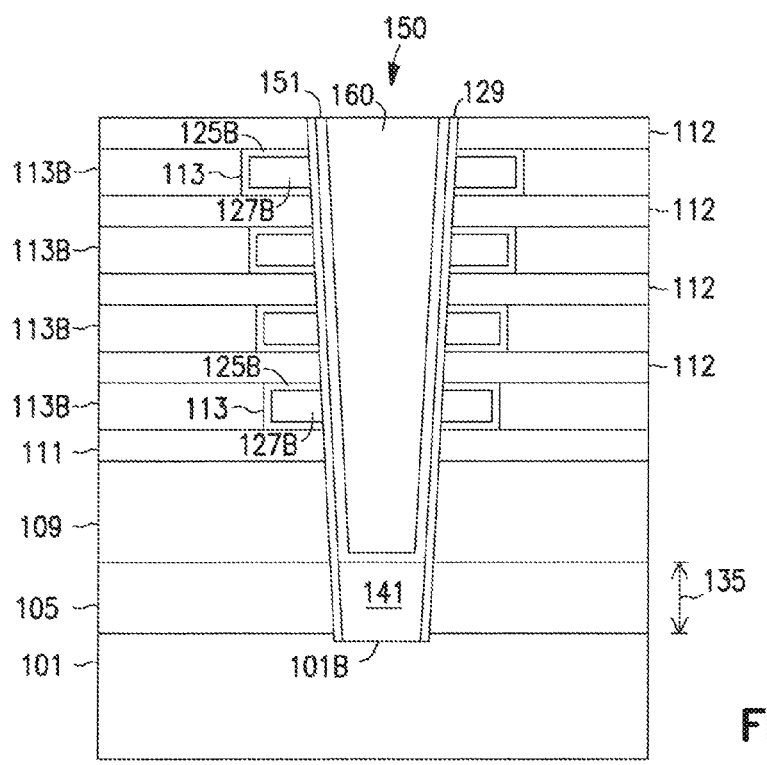

In FIG. 1J, a channel material 151 and dielectric material 160 can be formed, and cap material 114 can be removed. Channel material 151 can be formed on sidewalls and bottom of pillar opening 150, such that channel material 151 can have a bottom and sidewalls, forming a cup shape with an inner space without channel material 151. Dielectric material 160 can be formed, such that it occupies the space surrounded by at least a portion (e.g., surrounded by the bottom and vertical sidewalls) of channel material 151. In an alternative process, dielectric material 160 can be omitted and channel material 151 can fill pillar opening 150 including the space occupied by the omitted dielectric material 160.

Channel material 151 may include polysilicon or other semiconductor material. For example, channel material 151 may include conductively-doped polysilicon material. Dielectric material 160 may include dielectric materials described above (e.g., silicon dioxide, nitride, or other dielectric materials).

The process of forming channel material 151 can also include introducing dopants into channel material 151. Examples of the dopants include phosphorus or arsenic. A doping concentration for channel material 151 may be different from a doping concentration for conductive plug 141. For example, a doping concentration in range from approximately $1E18$ atoms/cm$^3$ to approximately $1E19$ atoms/cm$^3$ may be used for channel material 151. The doping process can be performed while channel material 151 is formed (e.g., in-situ doping).

Channel material 151 and dielectric material 160 may be planarized (e.g., using a chemical-mechanical polishing (or planarization) (CMP) technique) before cap material 114 is removed. Cap material 114 may be removed after the CMP of channel material 151 and dielectric material 160. Alternatively, cap material 114, channel material 151, and dielectric material 160 may be removed in one step (e.g., in the same CMP). After cap material 114 is removed, another CMP may be performed so that an upper surface tunneling material 129, an upper surface of channel material 151, an upper surface of dielectric material 160 are coplanar with an upper surface of the top most level of dielectric materials 112.

Channel material 151 and conductive plug 141 are portions of a cell pillar of memory device 100. Thus, as described above with reference to FIG. 1A through FIG. 1J, forming the cell pillar of memory device 100 can include forming different portions of the cell pillar at different times. For example, forming the cell pillar of memory device 100 can include forming an initial portion (e.g., a solid portion including conductive plug 141 in FIG. 1I) of the cell pillar from a conductively-doped polysilicon material (e.g., source material 101). Then, another portion (e.g., a hollow portion including channel material 151 in FIG. 1J) of the cell pillar can be formed that contacts the initial portion (e.g., conductive plug 141) of the cell pillar.

A person of ordinary skill in the art and familiar with this disclosure will recognize that additional processes can be performed to complete memory device 100. For example, additional processes may be performed to form an additional select gate material (not shown in FIG. 1J) that can form part of a drain-side select gate (SGD) over the levels of memory cells (e.g., over the memory cell stack) of memory device 100. The additional processes may also form data lines (e.g., bit lines), which are not shown in FIG. 1J, above the levels of memory cells of memory device 100, such that the levels of the memory cells are between such data lines and source material 101. The additional processes also form features that couple one of such data lines to channel material 151. This allows the cell pillar (which includes channel material 151 and conductive plug 141) of memory device 100 to conduct current between a data line of memory device 100 and a source (which includes source material 101) of memory device 100 in a memory operation (e.g., a read or write operation) of memory device 100.

Including conductive plug 141 in a cell pillar of memory device 100 may enhance operations of memory device 100. For example, in a memory device, such as memory device 100, a good overlap of a junction at portion 101B of source material 101 and semiconductor material 109 (part of the SGS structure) may be considered in order to achieve good string current (e.g., cell pillar current) during a memory operation (e.g., read or write) and high enough gate-induced drain leakage (GIDL) current to enable fast erase operation. In some cases, such a good overlap may be limited by the thickness (e.g., thickness 135) of etch stop 105 located between source material 101 and semiconductor material 109. For example, in some cases, etch stop 105 may have a relatively greater thickness (e.g., greater than 30 nanometers) to allow control of a depth of a pillar opening (e.g., pillar openings 110 (FIG. 1B) or 120 (FIG. 1C) formed in levels of materials over etch stop 105. This thickness of etch stop 105 may prevent a good overlap of source material 101 and semiconductor material 109. Further, as shown in FIG. 1C, opening 105A may partially extend to portion 101B of source material 101. This increases the distance between source material 101 and semiconductor material 109, thereby further limiting a good overlap of source material 101 and semiconductor material 109.

Without conductive plug 141 in FIG. 1J, to achieve good string current and high enough GIDL as mentioned above, source material 101 may be formed with a relatively higher amount of dopants (e.g., may be heavily doped) in order to allow an adequate amount of dopants from source material 101 to diffuse into the portion of channel material 151 adjacent to the edge (at sidewall portion 209) of semiconductor material 109. In some cases, however, a higher amount of dopants in source material 101 may lead to a variation in the diffusion in the overlap of source material 101 and semiconductor material 109. This may lead to a variation in the string current and the threshold voltage of a transistor (e.g., SGS transistor) that includes a portion of semiconductor material 109 as its gate.

Conductive plug 141 places portion 101B (e.g., source junction) closer to the edge (at sidewall portion 209) of semiconductor material 109, independent of the thickness (e.g., thickness 135) of etch stop 135. As shown in FIG. 1J, conductive plug 141 (which can be heavily doped) can be viewed as an extension of source material 101 and that directly faces the edge (at sidewall portion 209) of semiconductor material 109. This enables a good overlap of source material 101 and semiconductor material 109 (through conductive plug 141) to be achieved, independent of thickness (e.g., thickness 135) of etch stop 135. This overlap provided by conductive plug 141 may improve string current, GIDL, and the threshold voltage in memory device 100.

FIG. 2A through FIG. 2J show different portions of a fabrication process to form memory cells (e.g., memory cell stack of a memory array) of a memory device 200, according to an embodiment of the invention. Some of the processes, features, and materials described below with reference to FIG. 2A through FIG. 2J can be similar to, or identical to, those described above with reference to FIG. 1A through FIG. 1J. Thus, for simplicity, similar or identical processes, features, and materials between FIG. 1A through FIG. 1J and FIG. 2A through FIG. 2J are not repeated in the description associated with FIG. 2A through FIG. 2J.

As described above with reference to FIG. 1A through FIG. 1J, the levels of memory cells (that include charge-storage structures 127B in FIG. 1H) of memory device 100 can be formed before conductive plug 141 (FIG. 1I) is formed. As described below with reference to FIG. 2A through FIG. 2J, the level of memory cells can be formed after a conductive plug (e.g., conductive plug 241 in FIG. 2C) is formed. Further, as described above, semiconductor material 109 (e.g., SGS gate material) and channel material 151 (FIG. 1J) of memory device 100 are separated from each other by a dielectric material (e.g., tunneling material 129). As described below with reference to FIG. 2A through FIG. 2J, semiconductor material 109 and a channel material (e.g., channel material 251 in FIG. 2J) of memory device 200 are separated from each other by a dielectric (e.g., two or more dielectric materials) that can be thicker than tunneling material 129 in FIG. 1J of memory device 100.

Figure 2A:
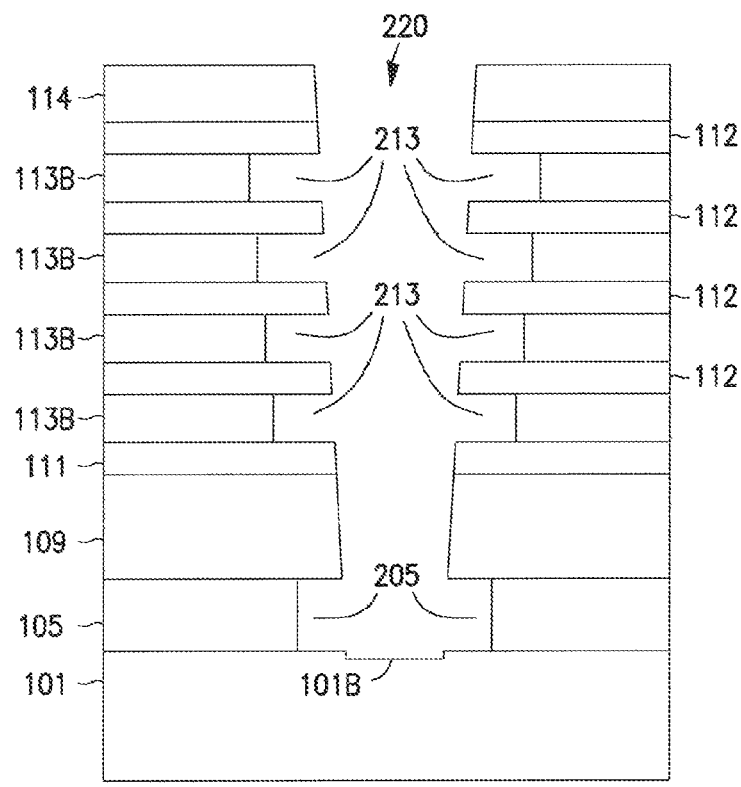
FIG. 2A through FIG. 2J show different portions of another fabrication process to form memory cells of a memory device, according to an embodiment of the invention.

In FIG. 2A, a recessed pillar opening 220 can be formed through control gates 113B, dielectric material 111, the SGS structure including semiconductor material 109, and etch stop 105. Forming recessed pillar opening 220 can include forming a recess 205 adjacent etch stop 105 and forming recesses 213 adjacent respective control gates 113B. Recess 205 and recesses 213 can be formed at different times. Recesses 213 are similar to recesses 113 of FIG. 1C.

Figure 2B:
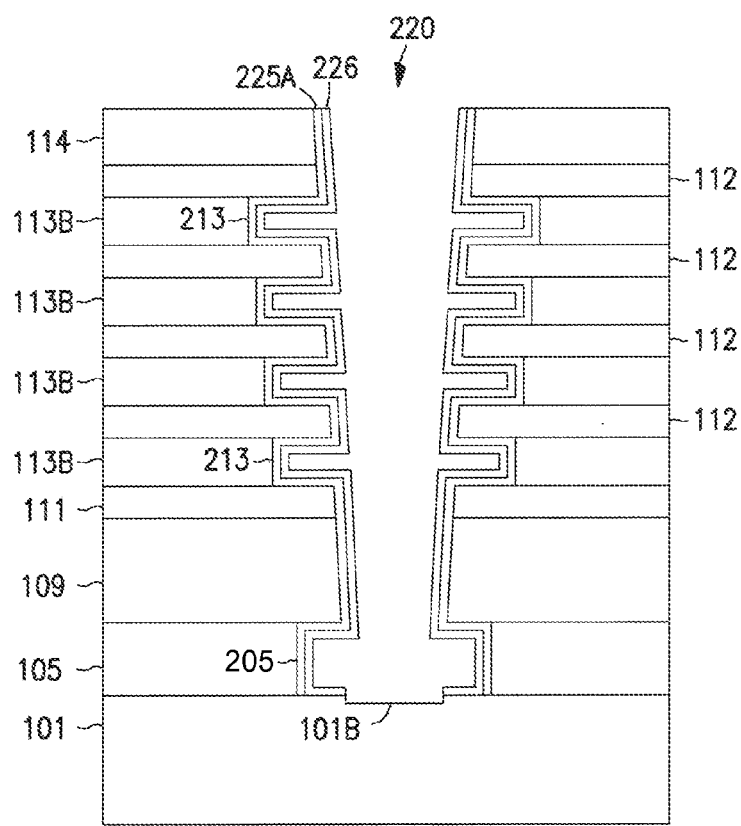

In FIG. 2B, a dielectric material 225A can be formed on sidewalls of recessed pillar opening 220 including sidewalls of each of recesses 213 and sidewalls of recess 205. Dielectric material 225A may include a single material (e.g., silicon dioxide) or a combination of two or more materials (g., silicon dioxide and silicon nitride). For example, dielectric material 225A can be part of an IPD material (e.g., part of ONO material), such that it can include silicon dioxide and silicon nitride materials. The silicon dioxide material included in dielectric material 225A can be formed on sidewalls of recessed pillar opening 220 including sidewalls of each of recesses 213 and sidewalls of recess 205. Then, the silicon nitride material included in dielectric material 225A can be formed on the silicon dioxide material.

As shown in FIG. 2B, a sacrificial material (e.g., silicon dioxide) 226 can be formed adjacent dielectric material 225A to protect dielectric material 225A from subsequent processes. For example, as shown in FIG. 2B, a portion of sacrificial material 226 at the bottom is removed (e.g., by a punch-etch operation), such that portion 101B of source material 101 is exposed through recessed pillar opening 220.

Figure 2C:
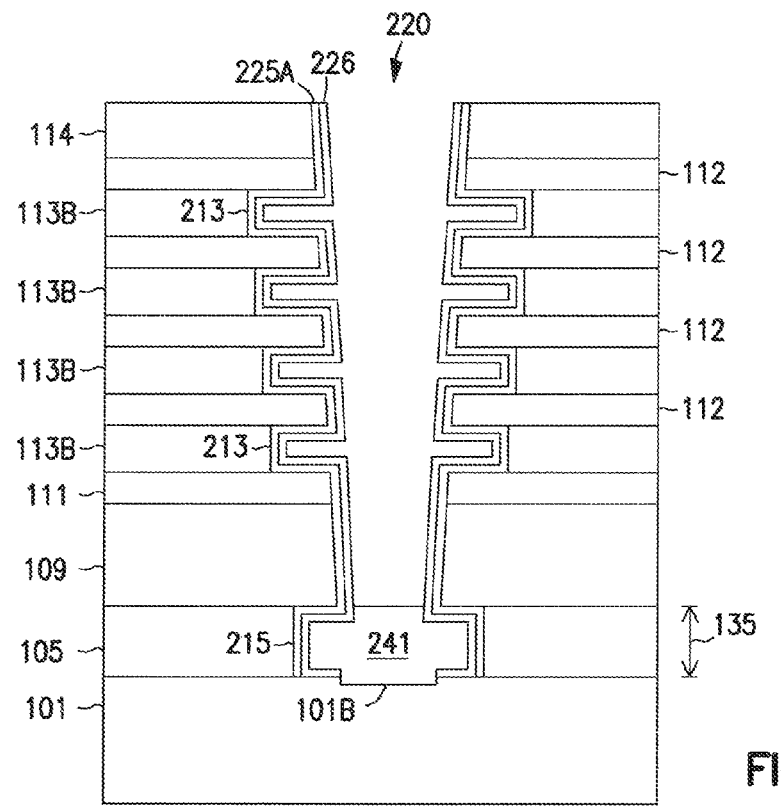

In FIG. 2C, a conductive plug 241 can be formed on portion 101B of source material 101. Conductive plug 241 directly contacts portion 101B. Conductive plug 241 can be considered as a source junction plug of memory device 200. Conductive plug 241 can include the same material as that of conductive plug 141 (FIG. 1I) and can be formed using similar, or identical, processes used to form conductive plug 141. Conductive plug 241 can provide similar enhancements as that of conductive plug 141 of FIG. 1J. After conductive plug 241 is formed, memory cells of memory device 200 can be formed, as described below.

Figure 2D:
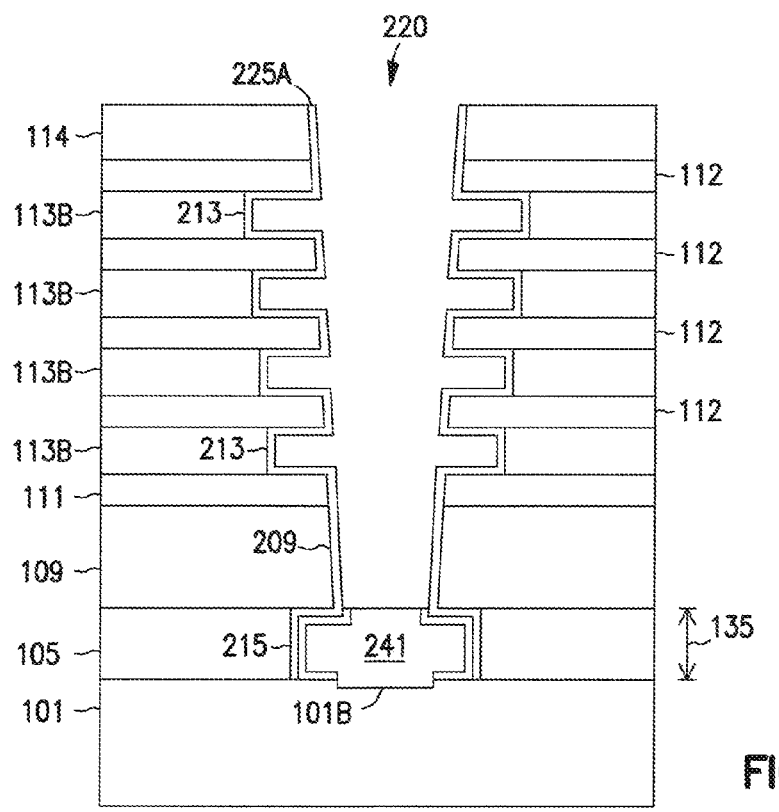

In FIG. 2D, after conductive plug 241 is formed, sacrificial material 226 is removed but dielectric material 225A is not removed. Dielectric material 225A remains on a sidewall portion 209 (of recessed pillar opening 220) adjacent semiconductor material 109 (e.g., SGS gate material) and on a sidewall of recesses 205 adjacent etch stop 105. A portion of sacrificial material 226 (FIG. 2C) may also remain in recess 205 (FIG. 2D).

Figure 2E:
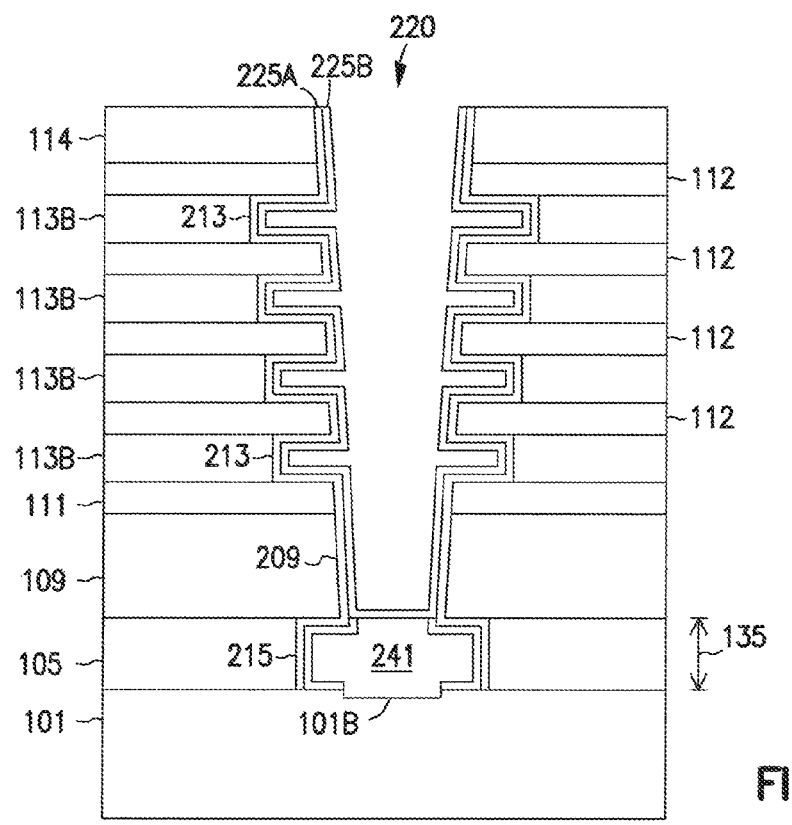

In FIG. 2E, a dielectric material 225B can be formed on dielectric material 225A and on conductive plug 241. Dielectric material 225B may include silicon dioxide. Dielectric material 225B (e.g., silicon dioxide) and dielectric material 225A (e.g., silicon dioxide and silicon nitride) may form an IPD material that includes ONO material.

Figure 2F:
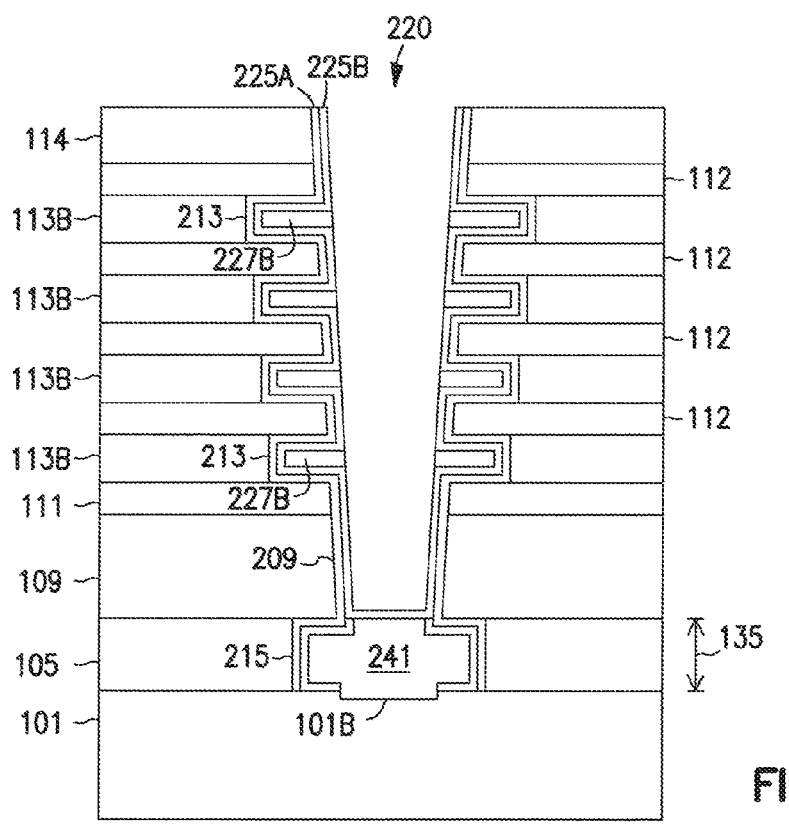

In FIG. 2F, a number of charge-storage structures 227B are formed in recesses 213. Charge-storage structures 227B may include the same material as that of charge-storage structures 127B (FIG. 1E) and can be formed by a process similar to, or identical to, that of charge-storage structures 127B.

As shown in FIG. 2F, each of charge-storage structures 227B in each of recesses 213 is electrically separated from at least proximate (e.g., adjacent) ones of control gates 113B by dielectric materials 225A and 225B in the recess. Each of charge-storage structures 227B can be configured to store information and can form part of a memory cell. FIG. 2F shows four memory cells (associated with four charge-storage structures 227B) on four different levels of memory device 200. These memory cells are part of a memory cell stack of memory device 200. FIG. 2F shows memory device 200 having four levels of memory cells as an example. The levels of memory cells in the memory cell stack of memory device 200 can vary.

Figure 2G:
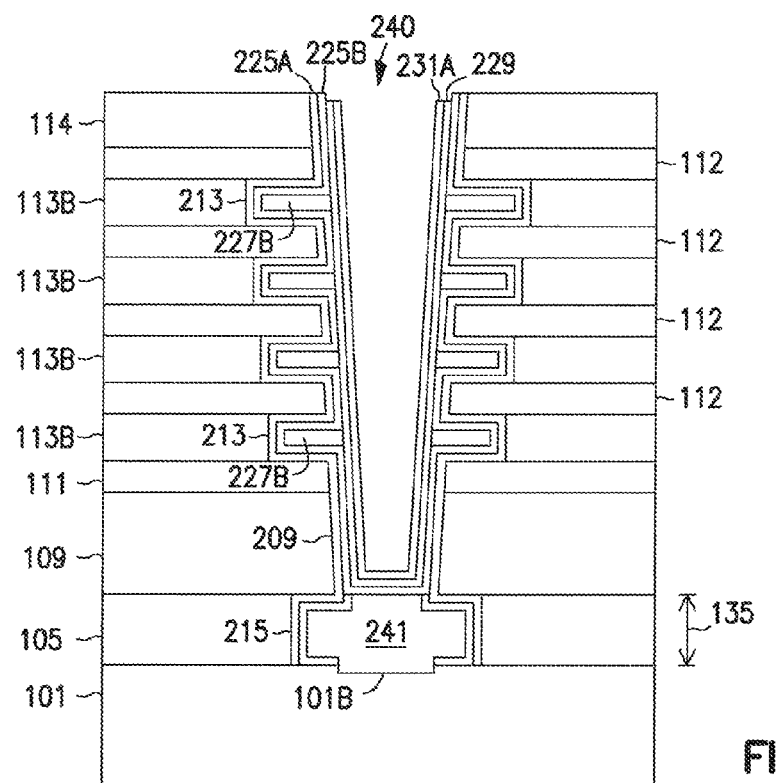

In FIG. 2G, a tunneling material 229 can be formed on sidewalls and bottom of pillar opening 240, followed by formation of a sacrificial liner 231A. Tunneling material 229 may include one or more of the dielectric materials discussed herein. Sacrificial liner 231A protects tunneling material 229 from a subsequent punch-etch operation. Tunneling material 229 and sacrificial liner 231A may include the same materials as tunneling material 129 and sacrificial liner 131A (FIG. 1F), respectively.

Figure 2H:
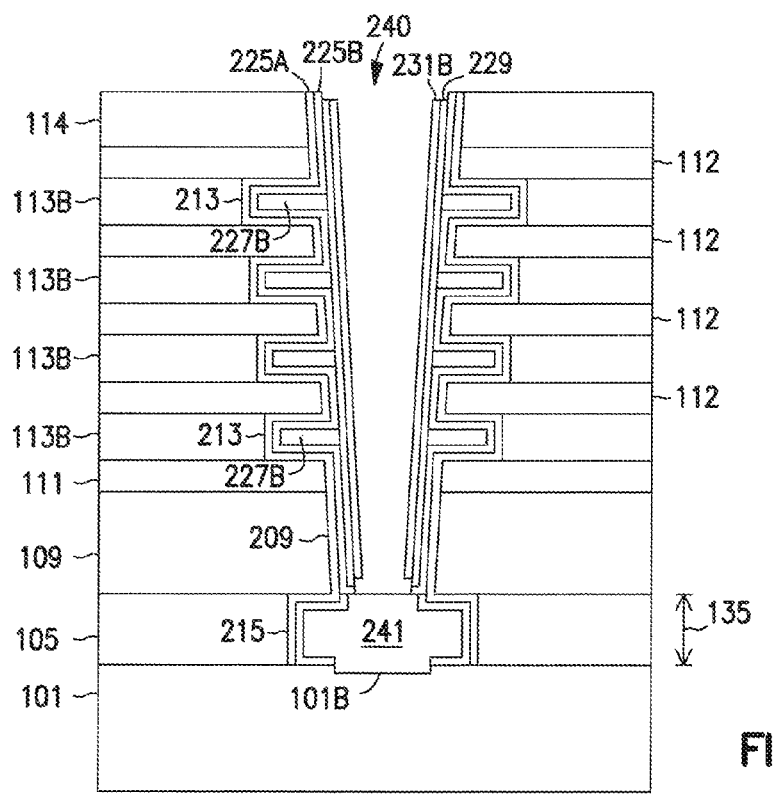

In FIG. 2H, sacrificial liner portions 231B can be formed by, for example, a punch-etch operation that clears at least the bottom portion of the sacrificial liner 231A (FIG. 2G), the bottom portion of tunneling material 229, and the bottom of dielectric material 225B. The punch-etch operation opens pillar opening 240 to source material 101 and exposes portion 101B of source material 101 at pillar opening 240.

Figure 2I:
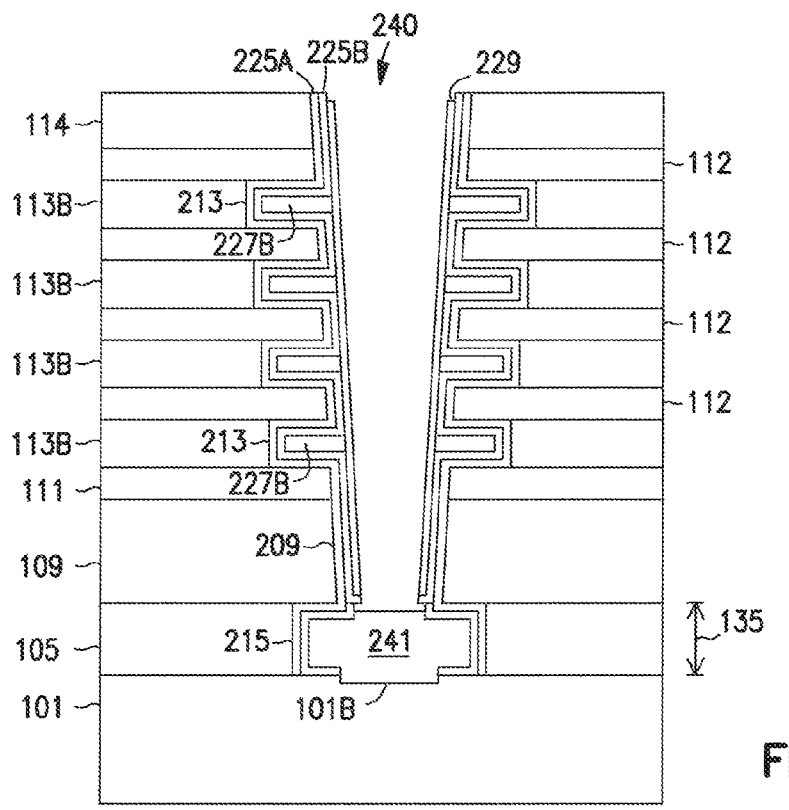

In FIG. 2I, sacrificial liner portions 231B (FIG. 2G) are removed but tunneling material 229 and dielectric material 225B are not removed. Tunneling material 229 and dielectric material 225B remain on sidewalls of pillar opening 240 including sidewall portion 209 adjacent semiconductor material 109 (e.g., SGS gate material).

The removal of sacrificial liner portions 231B may reduce the thickness of conductive plug 241. For example, if conductive plug 241 has a thickness (e.g., initial thickness) equal to thickness 135 after conductive plug 241 is formed (FIG. 2C), then the thickness (e.g., final thickness) of conductive plug 241 may be less than thickness 135 after sacrificial liner portions 231B (FIG. 1I) are removed. Thus, to compensate for a reduction in the thickness of conductive plug 241 (due to the removal of sacrificial liner portions 231B), conductive plug 241 may be formed with an initial thickness that is greater than its intended (e.g., final) thickness. For example, if the final thickness of conductive plug 241 is intended to be equal thickness 135, then the initial thickness of conductive plug 241 can be greater than thickness 135).

Figure 2J:
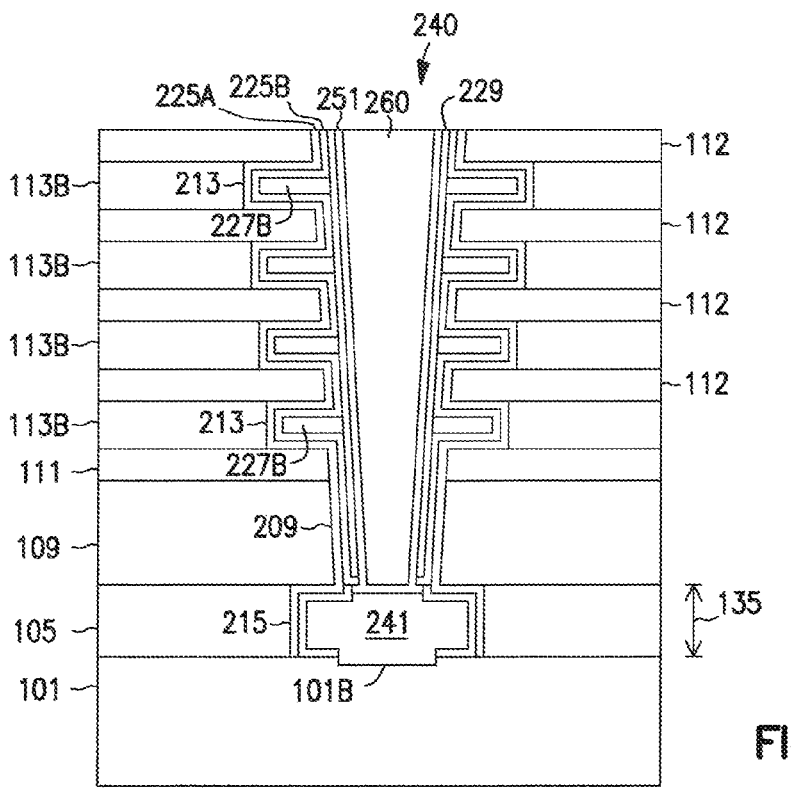

In FIG. 2J, a channel material 251 and dielectric material 260 can be formed, and cap material 114 can be removed. Channel material 251 can be formed on sidewalls and bottom of pillar opening 240, such that channel material 251 can have a bottom and sidewalls forming a cup shape with an inner space without channel material 251. The bottom of channel material 251 contacts conductive plug 241. Dielectric material 260 can be formed such that it occupies the space surrounded by at least a portion (e.g., surrounded by the bottom and vertical sidewalls) of channel material 251. In an alternative process, dielectric material 260 can be omitted and channel material 251 can fill pillar opening 240 including the space occupied by the omitted dielectric material 260.

Channel material 251 and conductive plug 241 are portions of a cell pillar of memory device 200. Thus, as described above with reference to FIG. 2A through FIG. 2J, forming the cell pillar of memory device 200 can include forming different portions of the cell pillar at different times. For example, forming the cell pillar of memory device 200 can include forming an initial portion (e.g., a solid portion including conductive plug 241 in FIG. 2C) of the cell pillar from a conductively-doped polysilicon material (e.g., source material 101). Then, another portion (e.g., a hollow portion including channel material 251 in FIG. 2J) of the cell pillar can be formed that contacts the initial portion (e.g., conductive plug 241) of the cell pillar.

A person of ordinary skill in the art and familiar with this disclosure will recognize that additional processes can be performed to complete memory device 200. For example, additional processes may be performed to form an additional select gate material (not shown in FIG. 2J) that can form part of a drain-side select gate (SGD) over the levels of memory cells (e.g., over the memory cell stack) of memory device 200. The additional processes may also form data lines (e.g., bit lines), which are not shown in FIG. 2J, above the levels of memory cells of memory device 200, such that the levels of the memory cells are between such data lines and source material 101. The additional processes also form features that couple one of such data lines to channel material 251. This allows the cell pillar (which includes channel material 251 and conductive plug 241) of memory device 200 to conduct current between a data line of memory device 200 and a source (which includes source material 101) of memory device 200 in a memory operation (e.g., a read or write operation) of memory device 200.

As shown in FIG. 2J, the dielectric materials adjacent sidewall portion 209 between semiconductor material 109 (e.g., part of the SGS structure) and channel material 251 include different dielectric materials (e.g., dielectric materials 225A and 225B (e.g., ONO) and tunneling material 129). The total thickness of the combination of dielectric materials 225A, 225B, and tunneling material 129 can be greater than the thickness of tunneling material 129 (FIG. 1J) at the same location between semiconductor material 109 and channel material 151 of memory device 100 in FIG. 1J. A greater dielectric thickness may allow a transistor (e.g., SGS transistor) that includes a portion of semiconductor material 109 as its gate (FIG. 2J) of memory device 200 to have a higher threshold voltage than the transistor (e.g., SGS transistor) that includes a portion of semiconductor material 109 as its gate (FIG. 1J) of memory device 100. Thus, memory device 200 may operate with a transistor (e.g., SGS transistor) having a higher threshold voltage than a transistor (e.g., SGS transistor) in memory device 100. In an alternative structure, dielectric material 225B may be removed from memory device 200.

Figure 3:
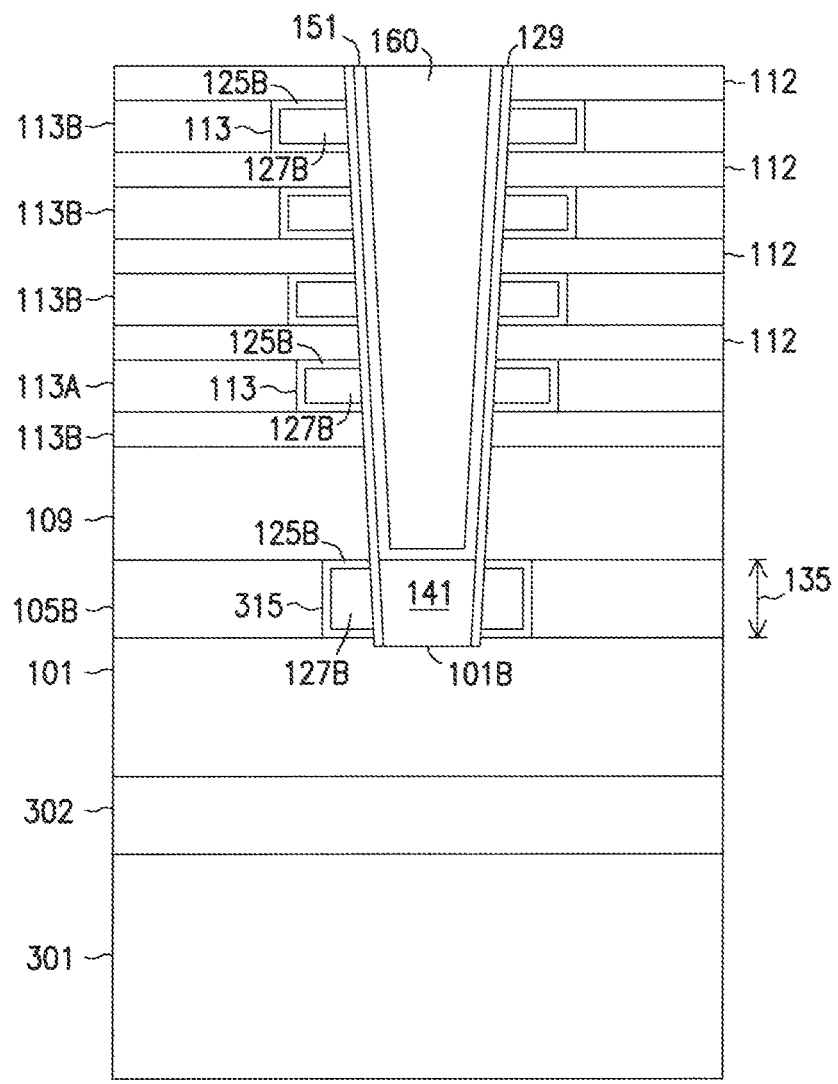
FIG. 3 shows a portion of a memory device that can be a variation of the memory device of FIG. 1A through FIG. 1J, according to an embodiment of the invention.

FIG. 3 shows a portion of a memory device 300 that can be a variation of memory device 100 of FIG. 1J, according to an embodiment of the invention. As shown in FIG. 3, memory device 300 can include features and materials similar to, or identical to, those of memory device 100 of FIG. 1J. Thus, for simplicity, similar or identical features and materials in between FIG. 3 and FIG. 1A through FIG. 1J are not repeated in the description associated with FIG. 3.

As shown in FIG. 3, memory device 300 can include a substrate 301 and a material 302 between source material 101 and substrate 301. Substrate 301 may include a semiconductor (e.g., silicon) substrate. Material 302 may include a transition metal combined with a semiconductor material. For example, material 302 may include a silicide material (e.g., tungsten silicide). In an alternative structure, material 302 is omitted from device 300, such that source material 101 can directly contact substrate 301.

Memory device 300 can also include a recess 315 adjacent etch stop 105 and between etch stop 105 and conductive plug 141, and CBD material 125B and charge-storage structures 127B located in recess 315. In some processes, CBD material 125B and charge-storage structures 127B in recess 315 can be formed at the same time that CBD material 125B and charge-storage structures 127B are formed in recesses 113 are formed (e.g., formed by similar processes described above with reference to FIG. 1A through FIG. 1E). Although recess 315 may include charge-storage material 127B, the charge-storage structures 127B in recess 315 is not configured to store information.

Figure 4:
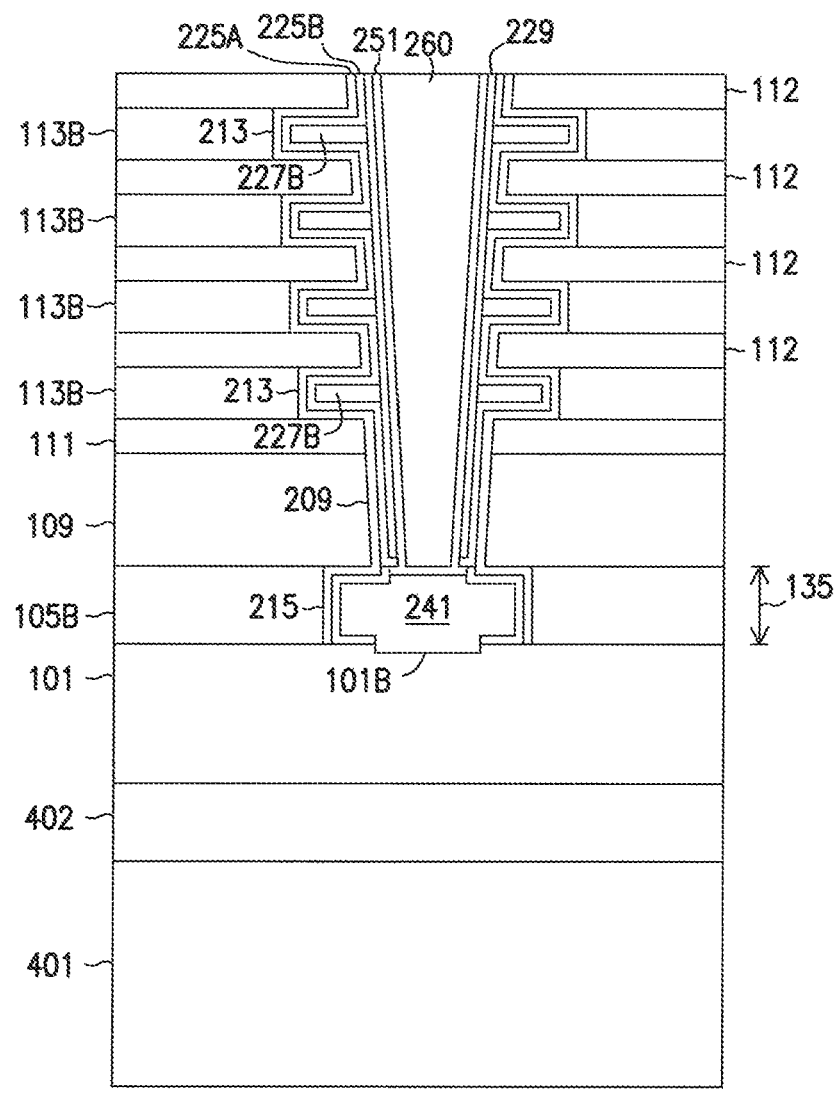
FIG. 4 shows a portion of a memory device that can be a variation of the memory device of FIG. 2A through FIG. 2J, according to an embodiment of the invention.

FIG. 4 shows a portion of a memory device 400 that can be a variation of memory device 200 of FIG. 2J, according to an embodiment of the invention. As shown in FIG. 4, memory device 400 can include features and materials similar to, or identical to, those of memory device 200 of FIG. 2J. Thus, for simplicity, similar or identical features and materials in between FIG. 4 and FIG. 2A through FIG. 2J are not repeated in the description associated with FIG. 4.

As shown in FIG. 4, memory device 400 can include a substrate 401 and a material 402 between source material 101 and substrate 401. Substrate 401 may include a semiconductor (e.g., silicon) substrate. Material 402 may include a transition metal combined with a semiconductor material. For example, material 402 may include a silicide material (e.g., tungsten silicide). In an alternative structure, material 402 is omitted from device 400, such that source material 201 can directly contact substrate 401.

The illustrations of the apparatuses (e.g., memory devices 100, 200, 300, and 400) and methods (e.g., processes described above with reference to FIG. 1A through FIG. 4) are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 4 include apparatuses and methods having a source material, a dielectric material over the source material, a select gate material over the dielectric material, a memory cell stack over the select gate material, a conductive plug located in an opening of the dielectric material and contacting a portion of the source material, and a channel material extending through the memory cell stack and the select gate material and contacting the conductive plug. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
    a source material;
    a dielectric material over the source material, the dielectric material including an opening, the opening including a recess, the recess including a first recess sidewall and a second recess sidewall opposite from the first recess sidewall;
    a select gate material over the dielectric material, the select gate material including an opening having a first side wall and a second sidewall opposite from the first sidewall;
    a memory cell stack over the select gate material;
    a conductive plug located in the opening including the recess of the dielectric material and contacting a portion of the source material, the conductive plug including an epitaxial material;
    a channel material extending through the memory cell stack and through the select gate material between the first and second sidewalls of the select gate material and contacting the conductive plug, wherein a distance between the first and second recess sidewalk is greater than a distance between the first and second sidewalls of the opening of the select gate material; and
    a metal combined with a semiconductor material, wherein the source material is between the dielectric material and the metal combined with the semiconductor material.

2. The apparatus of claim 1, wherein the dielectric material includes a dielectric constant greater than a dielectric constant of silicon dioxide.

3. The apparatus of claim 1, further comprising an additional dielectric material surrounded by at least a portion of the channel material.

4. The apparatus of claim 1, wherein the source material includes a conductively-doped polysilicon.

5. The apparatus of claim 1, further comprising a silicon nitride material between the channel material and the select gate material.

6. The apparatus of claim 5, further comprising silicon dioxide material between the channel material and the select gate material.

7. The apparatus of claim 1, further comprising oxide-nitride-oxide (ONO) material between the channel material and the select gate material.

8. The apparatus of claim 1, wherein the select gate material includes conductively-doped polysilicon.

9. The apparatus of claim 1, further comprising an additional dielectric material located in the recess and in between the conductive plug and the dielectric material over the source material.

10. An apparatus comprising:
    a source material;
    a dielectric material over the source material, the dielectric material including an opening;
    a select gate material over the dielectric material;
    a memory cell stack over the select gate material;
    a conductive plug located in the opening of the dielectric material and contacting a portion of the source material;
    a channel material extending through the memory cell stack and the select gate material and contacting the conductive plug; and
    a transition metal combined with a semiconductor material, wherein the source material is between the dielectric material and the transition metal combined with the semiconductor material.

11. The apparatus of claim 1, further comprising an additional select gate material over the memory cell stack.

12. An apparatus comprising:
    a source material;
    a first dielectric material over the source material, the first dielectric material including a dielectric constant greater than a dielectric constant of silicon dioxide;
    a source-side select (SGS) gate material over the first dielectric material;
    levels of memory cells over the SGS select gate material;
    a cell pillar extending through the levels of memory cells, the SGS gate material, and the first dielectric material, the cell pillar including a conductive plug contacting the source material, the conductive plug including an epitaxial material, a channel material contacting the conductive plug, and a second dielectric material surrounded by at least a portion of the channel material; and
    a metal combined with a semiconductor material, wherein the source material is between the dielectric material and the metal combined with the semiconductor material.

13. The apparatus of claim 12, wherein the conductive plug has a thickness of at least one-half of a thickness of the first dielectric material.

14. The apparatus of claim 12, wherein the first dielectric material has a thickness greater than 30 nanometers.

15. The apparatus of claim 12, wherein the second dielectric material has a dielectric constant less than the dielectric constant of the first dielectric material.

16. An apparatus comprising:
    a source material;
    a first dielectric material over the source material, the first dielectric material including a dielectric constant greater than a dielectric constant of silicon dioxide;

a source-side select (SGS) gate material over the first dielectric material;
levels of memory cells over the SGS select gate material;
a cell pillar extending through the levels of memory cells, the SGS gate material, and the first dielectric material, the cell pillar including a conductive plug contacting the source material, a channel material contacting the conductive plug, and a second dielectric material surrounded by at least a portion of the channel material; and
a substrate and a silicide material between the substrate and the source material.

17. A method comprising:
forming a source material;
forming a dielectric material over the source material;
forming a source-side select (SGS) gate material over the dielectric material;
forming alternating levels of materials over the SGS gate material;
forming a first portion of a cell pillar, the first portion of the cell pillar contacting the source material and located between the alternating levels of materials and the source material, wherein forming the first portion of the cell pillar includes growing an epitaxial material from a portion of the source material, such that the epitaxial material is part of the first portion of the cell pillar;
forming a second portion of the cell pillar after the first portion of the cell pillar is formed, the second portion of the cell pillar contacting the first portion of the cell pillar and extending through the alternating levels of materials; and
forming a metal combined with a semiconductor material, wherein the source material is between the dielectric material and the metal combined with the semiconductor material.

18. The method of claim 17, wherein the dielectric material has a dielectric constant greater than a dielectric constant of silicon dioxide.

19. The method of claim 17, further comprising:
introducing dopants into the first portion of the cell pillar; and
introducing dopants into the second portion of the cell pillar, wherein a concentration of the first dopants is different from a concentration of the second dopants.

20. The method of claim 17, wherein forming the alternating levels of materials includes forming a number of levels of conductor materials and a number of levels of dielectric materials.

21. The method of claim 17, further comprising:
forming levels of memory cells in the alternating levels of materials before forming the first portion of the cell pillar.

22. The method of claim 17, further comprising:
forming levels of memory cells in the alternating levels of materials after forming the first portion of the cell pillar.

23. The method of claim 17, further comprising:
forming an additional dielectric material in a space surrounded by part of the second portion of the cell pillar.

24. A method comprising:
forming a source material;
forming a dielectric material over the source material;
forming a select gate material over the dielectric material;
forming alternating levels of materials over the select gate material;
forming an opening through the alternating levels of materials, the select gate material, and the dielectric material, such that a portion of the source material is exposed through the opening;
forming a conductive plug contacting the portion of the source material that is exposed through the opening; and
forming a channel material extending through the alternating levels of materials and the select gate material and contacting the conductive plug, wherein forming the conductive plug includes growing an epitaxial material from the portion of the source material, such that the epitaxial material is part of the conductive plug.

25. The method of claim 24, further comprising:
introducing dopants into the epitaxial material while the epitaxial material is formed.

26. The method of claim 24, further comprising:
introducing dopants into the epitaxial material after the epitaxial material is formed.

27. The method of claim 24, wherein the dielectric material includes aluminum oxide.

28. The method of claim 24, further comprising:
forming a first additional dielectric material before forming the conductive plug, such that the first additional dielectric material is on a sidewall adjacent the select gate material and adjacent the dielectric material over the source material.

29. The method of claim 28, further comprising:
forming a second additional dielectric material on the first additional dielectric material, wherein the first and second additional dielectric materials are not removed after the channel material is formed.

30. The method of claim 29, further comprising:
forming a tunneling material between the channel material and the first and second additional dielectric materials.

31. The method of claim 24, wherein further comprising:
forming an additional dielectric material in a recess between the conductive plug and the dielectric material over the source material before forming the conductive plug.

* * * * *